(12) United States Patent
Buchwalter et al.

(10) Patent No.: US 7,523,852 B2
(45) Date of Patent: Apr. 28, 2009

(54) SOLDER INTERCONNECT STRUCTURE AND METHOD USING INJECTION MOLDED SOLDER

(75) Inventors: Stephen L. Buchwalter, Hopewell Junction, NY (US); Claudius Feger, Poughkeepsie, NY (US); Peter A. Gruber, Mohegan Lake, NY (US); Sung K. Kang, Chappaqua, NY (US); Paul A. Lauro, Brewster, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/005,557

(22) Filed: Dec. 5, 2004

(65) Prior Publication Data

US 2006/0118604 A1 Jun. 8, 2006

(51) Int. Cl.
*B23K 35/12* (2006.01)
(52) U.S. Cl. ..................... 228/246; 228/56.3
(58) Field of Classification Search ................. 228/246, 228/33, 215, 254, 253, 56.3, 262.1, 180.22, 228/245
See application file for complete search history.

(56) References Cited

U.S. PATENT DOCUMENTS

| | | | | |
|---|---|---|---|---|
| 2,922,092 | A * | 1/1960 | Gazzara et al. ............... 257/747 |
| 4,642,889 | A * | 2/1987 | Grabbe ........................ 29/840 |
| 4,705,205 | A * | 11/1987 | Allen et al. ............ 228/180.22 |
| 4,914,814 | A * | 4/1990 | Behun et al. .................. 29/843 |
| 5,244,143 | A * | 9/1993 | Ference et al. ......... 228/180.21 |
| 5,349,495 | A * | 9/1994 | Visel et al. .................. 361/774 |
| 5,476,211 | A * | 12/1995 | Khandros ................ 228/180.5 |
| 5,718,361 | A * | 2/1998 | Braun et al. ................ 228/56.3 |
| 5,718,367 | A * | 2/1998 | Covell et al. ................. 228/254 |
| 5,775,569 | A * | 7/1998 | Berger et al. ................. 228/254 |
| 6,024,274 | A * | 2/2000 | Chang et al. ........... 228/180.22 |
| 6,056,191 | A | 5/2000 | Brouillette et al. .......... 228/254 |
| 6,283,359 | B1 * | 9/2001 | Brofman et al. ......... 228/180.22 |
| 6,365,973 | B1 * | 4/2002 | Koning ........................ 257/772 |
| 6,406,991 | B2 * | 6/2002 | Sugihara ..................... 438/613 |
| 6,815,613 | B2 * | 11/2004 | Gebauer et al. ............ 174/52.1 |
| 6,906,598 | B2 * | 6/2005 | Roberson et al. .......... 333/24 R |
| 2002/0179689 | A1 * | 12/2002 | Tung .......................... 228/197 |
| 2004/0144834 | A1 | 7/2004 | Nomoto et al. |

* cited by examiner

*Primary Examiner*—Jessica L Ward
*Assistant Examiner*—Michael Aboagye
(74) *Attorney, Agent, or Firm*—Daniel P. Morris; David Aker

(57) ABSTRACT

Improved interconnects are produced by injection molded solder which fills mold arrays with molten solder so that columns that have much greater height to width aspect ratios greater than one are formed, rather than conventional flip chip bumps. The columns may have filler particles or reinforcing conductors therein. In the interconnect structures produced, the cost and time of a subsequent underfill step is reduced or avoided. The problem of incompatibility with optical interconnects between chips because underfills require high loading of silica fillers which scatter light, is solved, thus allowing flip chips to incorporate optical interconnects.

13 Claims, 12 Drawing Sheets

SOLDER INTERCONNECT STRUCTURE AND METHOD USING INJECTION MOLDED SOLDER

FIELD OF THE INVENTION

This invention relates to the field of solder interconnects formed between circuit devices and substrates forming the next layer of electrical interconnect. More specifically, the invention relates to improvements in injection molded solder technologies used to form solder bump interconnections, generally on silicon wafers.

BACKGROUND OF THE INVENTION

Semiconductor chips are commonly connected to other circuitry using solder bumps having a diameter of about 100 microns. These solder joints suffer thermal fatigue failures because of the difference in coefficient of thermal expansion (CTE) between the silicon and the chip carriers to which they are attached. Using the injection molded solder (IMS) technique, solder interconnects can be fabricated on semiconductor chips or chip carriers with controlled shape and composition to increase the fatigue life of the joints. Thus, this invention pertains to improvements of solder interconnections for better electrical performance and/or increased mechanical robustness and the fabrication process of same using IMS.

IMS is a relatively new process with many applications, primarily suited for low-cost solder bumping of semiconductor wafers. In IMS, a scanning head dispenses molten solder through a linear slot in the head over a mold plate to fill cavities therein with molten solder.

After the scan, the solder in the cavities is solidified and then the mold plate is aligned to and placed in contact with a wafer (or die or semiconductor chip) by an appropriate fixture. This assembly is then heated to facilitate reflow and transfer of the solder from the mold plate cavities to metallized pads on the wafer. After cooling and separating the wafer and mold plate, the wafer has been bumped with an array of solder preforms typically used for flip chip applications.

While the technology disclosed in U.S. Pat. No. 6,056,191, assigned to the assignee of the present invention, and entitled "Method and Apparatus for Forming Solder Bumps" represents a major advance in the art, it typically produces spherical solder joints that exhibit several problems. First, the spherical solder joints have limited fatigue life due to a difference in coefficient of thermal expansion between the silicon die and the substrate, often an organic material. To address this CTE mismatch, an additional underfill material is needed between the silicon die and substrate to reduce the mechanical stresses on the solder bumps. As the level of integration in silicon continues to increase, the number and density of solder interconnections also must increase, driving a reduction in size of the spherical solder joints and making it difficult or impossible for underfill to be used. Second, silicon chip sizes are increasing, which also limits the ability of underfills to reinforce conventional spherical solder interconnects. Third, power requirements for silicon devices are increasing, particularly for microprocessor chips; and conventional solder interconnects may not be able to withstand the higher currents needed to supply that power. Finally, as newer interconnect structures are developed such as optical interconnects, the underfill material itself will present a problem, since optical communication between the die and substrate is prevented due to the opaque nature of the material.

The first problem is shown in FIG. 1, wherein a die or chip 20 (typically an integrated circuit silicon chip) is electrically interconnected to a substrate 22 by a series of solder bumps 24, as is well known in the art. The typically small height to width aspect ratio (<1) of standard flip chip bumps makes the solder prone to mechanical stresses, which are greatest at the plane represented by arrows 26, as the chip power and temperature varies over its life. This CTE mismatch caused problem is aggravated as chips get larger and thus the DNP (distance to neutral point) is increased. Without underfill, interconnect failures happen at unacceptably short lifetimes.

FIG. 2 shows, in the regions between the solder bumps 24, an underfill layer 28 applied between the chip 20 and the substrate 22. This mitigates the stresses on the solder bumps themselves, but adds a processing step that is time-consuming and adds cost. As signal and power requirements increase, the smaller spherical size of each bump will not allow sufficient stand-off between the chip and the substrate, which has two deleterious effects. First, the capillary underfill process becomes very slow or impossible; and second, the mechanical stress from CTE mismatch is increased. Additionally, this underfill layer is generally opaque and thus prevents optical communication between the bottom of the chip 20 and the substrate 22, as may be desirable in advanced packaging schemes.

SUMMARY OF THE INVENTION

It is therefore an object of the present invention to provide improved solder interconnects and to a method for providing such interconnects.

It is another object of the invention to provide solder interconnects with greater standoff between chip and substrate to facilitate underfill reinforcement of the interconnects.

It is another object of the invention to provide solder interconnects of improved current carrying capacity.

It is another object of the invention to provide interconnections that are sufficiently mechanically robust that they can be used without the need to place optically blocking layers between the chip and substrate.

In accordance with the invention, a method for connecting an electrical device having first electrical connection surfaces to a substrate having corresponding second electrical connection surfaces, comprises forming a plurality of columns at least partially of solder so as to be electrically connected to one of the first surfaces and the second surfaces so that electrical connections are made to first ends of the columns; and forming electrical connections between the other of the first surfaces and second surfaces and second ends of the respective columns. The columns have an aspect ratio greater than one, such as between 1.5 and ten. The columns may be formed by injection molded soldering.

The columns may be formed of a first solder with a first melting point temperature, and the method may further comprise soldering the columns to the other of the first surfaces and second surfaces with a second solder having a second melting point temperature lower than the first melting point temperature. The second solder may be applied to at least one of the first surfaces and the second surfaces prior to connecting second ends of the columns to the second surfaces.

An elongate metal conductor of a material other than solder may be placed within the columns. The elongate metal conductor may be formed of a material selected from the group of copper, nickel, tantalum, tungsten, and ruthenium. The conductor may be coated with a solder-wettable metal, which may be selected from the group of nickel, gold and silver, or combinations thereof. The coating may be formed by electroplating.

The columns may be formed in a mold. The conductors may be placed in cavities of the mold prior to injecting solder into the cavities.

The placing of the conductors may comprise feeding a controlled length of the conductor into the cavities by using a wire bonding tool; and cutting an end of the conductor so that the conductor fits within the cavity.

The placing of the conductors may comprise aligning, with an array of cavities in the mold plate, an array of through-holes in a plate, the through-holes being slightly larger in diameter than the conductors; removably fastening the plate to the mold plate; placing conductors in the vicinity of the through-holes; and agitating the conductors over the through-holes until a respective conductor moves into each of the cavities. The placing may comprise using a programmable pick and place tool to insert a conductor into the cavities.

The solder of the columns may have filler particles therein. The filler particles may be mixed with the solder when the solder is in a molten state, prior to forming the columns. The particles may have a composition of metal, graphite, ceramic or a high temperature polymer.

The electrical device is generally a semiconductor chip. The substrate may be any conventional material or may be formed of an organic material. An underfill layer may be provided between the electrical device and the substrate.

The invention is also directed to an article of manufacture, comprising an electrical device having first electrical connection surfaces; a substrate having corresponding second electrical connection surfaces, and a plurality of columns at least partially of solder electrically connected to one of the first surfaces and the second surfaces so that electrical connections are made to first ends of the columns; and so that there are electrical connections between the other of the first surfaces and second surfaces and second ends of the respective columns. The columns may have an aspect ratio greater than one, such as between 1.5 and ten. The columns may be formed of injection molded solder. The columns may be formed of a first solder with a first melting point temperature, and the article may further comprise a second solder having a second melting point temperature lower than the first melting point temperature for electrically connecting the columns to the other of the first surfaces and second surfaces. The second solder may be disposed on at least one of the first surfaces and the second surfaces prior to connecting second ends of the columns to the second surfaces.

An elongate metal conductor of a material other than solder may be disposed within the columns. The elongate metal conductor may be of a material selected from the group of copper, nickel, tantalum, tungsten, and ruthenium. The conductor may have a solder-wettable metal coating. The solder wettable metal may be selected from the group of nickel, gold, silver, tin and combinations thereof. The coating may be an electroplated coating.

The solder may have filler particles therein. The particles may be comprised of metal, graphite, ceramic or a high temperature polymer.

The electrical device is generally a semiconductor chip. The substrate may be comprised a conventional material or of an organic material.

The article in accordance with the invention may further comprise a first electro-optical device having a portion disposed on a surface of the electrical device; and a second electro-optical device having a portion disposed on a surface the substrate; the first electro-optical device and the second electro-optical device being in facing relationship so as to allow transmission of light between the first electro-optical device and the second electro-optical device. The first electro-optical device and the second electro-optical device may be disposed between a plurality of the columns.

There may be no underfill material between the first electro-optical device and the second electro-optical device. In certain applications, an underfill layer may be disposed between the electrical device and the substrate.

The invention is also directed to an electrical interconnect device comprising an injection molded solder column having a diameter of between 25 microns and 150 microns and an aspect ratio of greater than one. The aspect ratio may be between 1.5 and ten. A reinforcing conductor may be disposed within the column. Filler particles may be disposed within the columns.

BRIEF DESCRIPTION OF THE DRAWINGS

These and other aspects, features, and advantages of the present invention will become apparent upon further consideration of the following detailed description of the invention when read in conjunction with the drawing figures, which are all enlarged cross-sectional views, wherein.

DESCRIPTION OF THE INVENTION

In general, mold cavities for solder bumps that are fabricated by etching chemically or by using a laser, are generally hemispherical in shape. However, the present inventors have determined that the transferred bumps may be molded to a shape which can be chosen to provide an increase in the fatigue resistance of the final solder joint.

Figure 1:
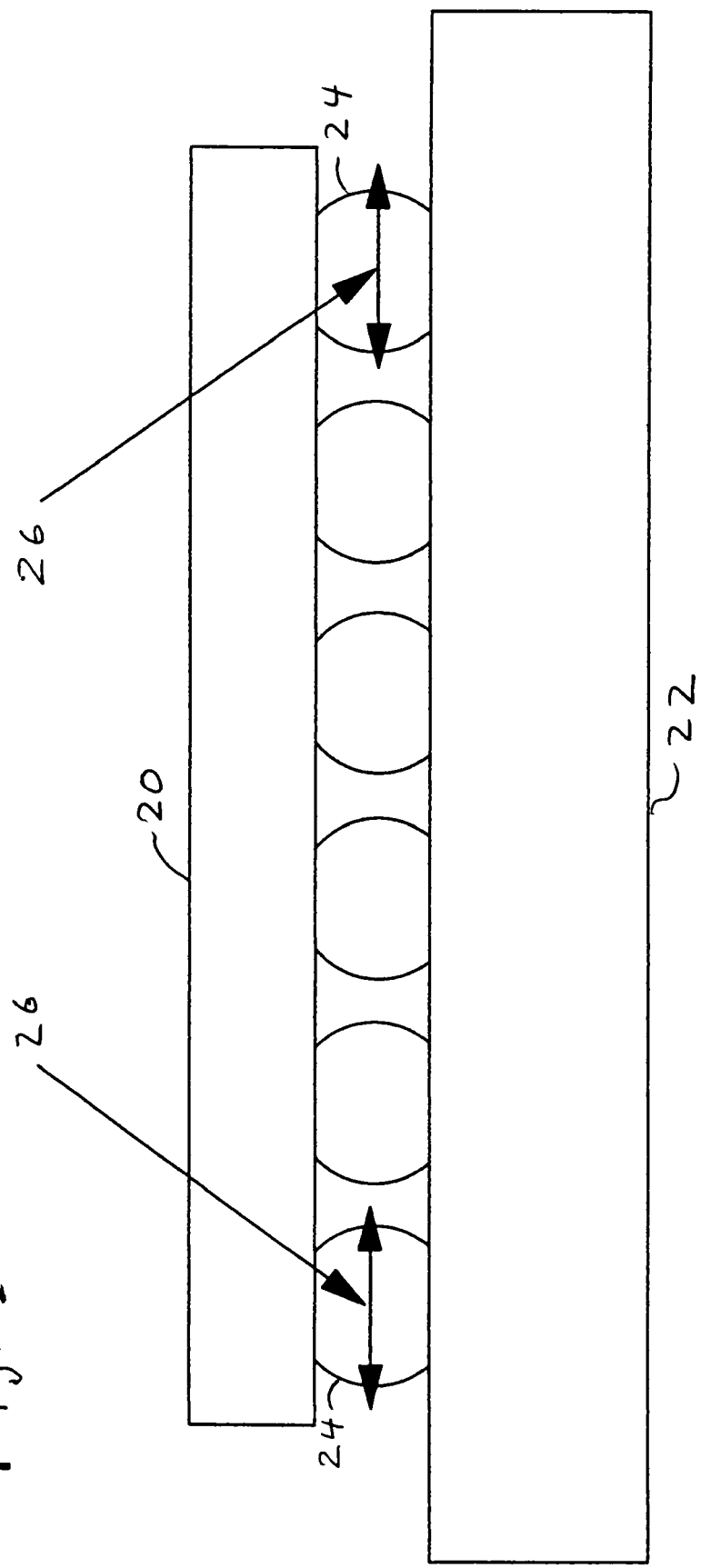
FIG. 1 shows flip chip bumps as practiced presently with commensurate stresses especially at the perimeter.
Figure 2:
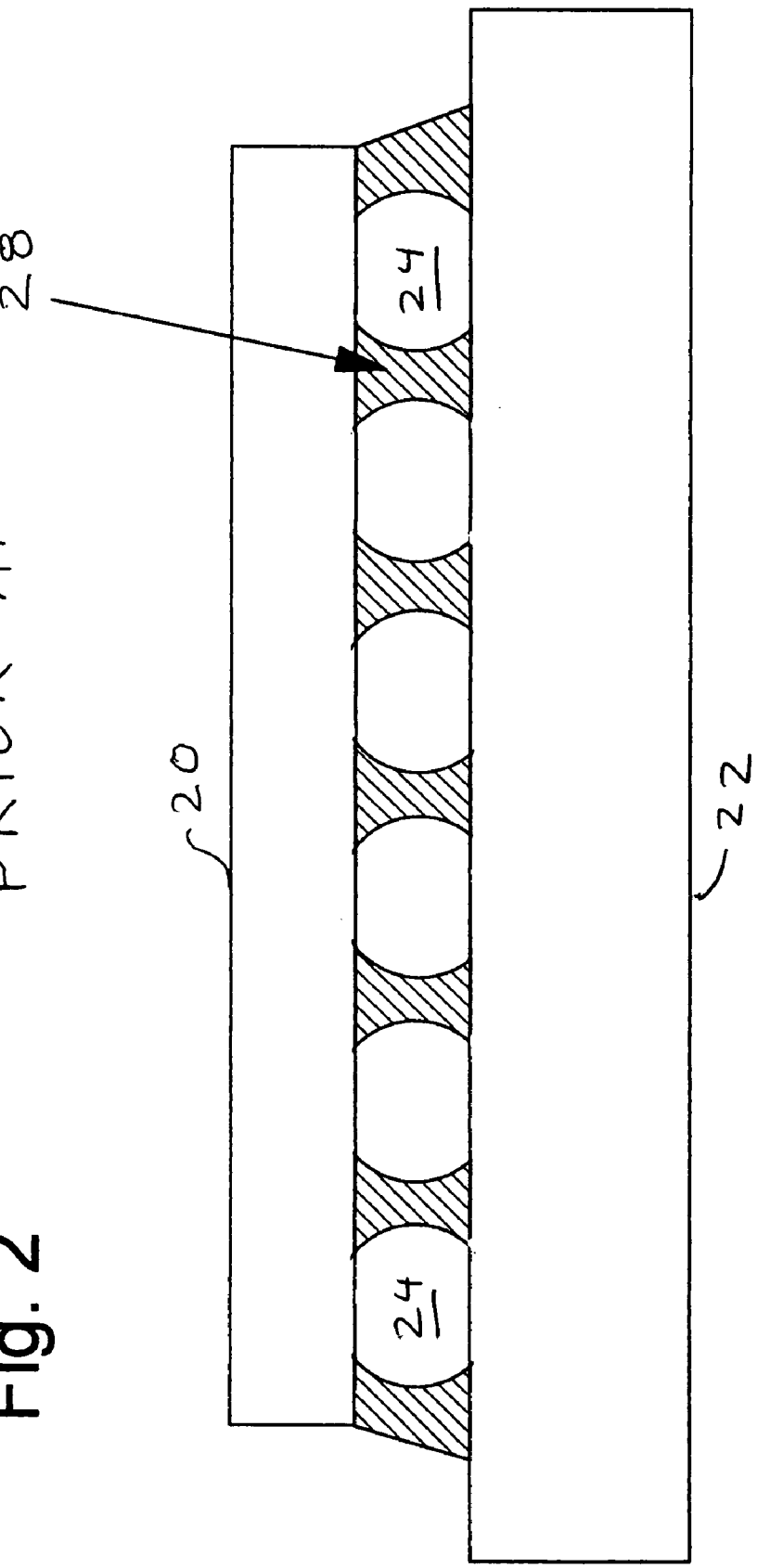
FIG. 2 shows underfill applied to flip chip bumps as practiced presently to mitigate mechanical stresses.
Figure 3:
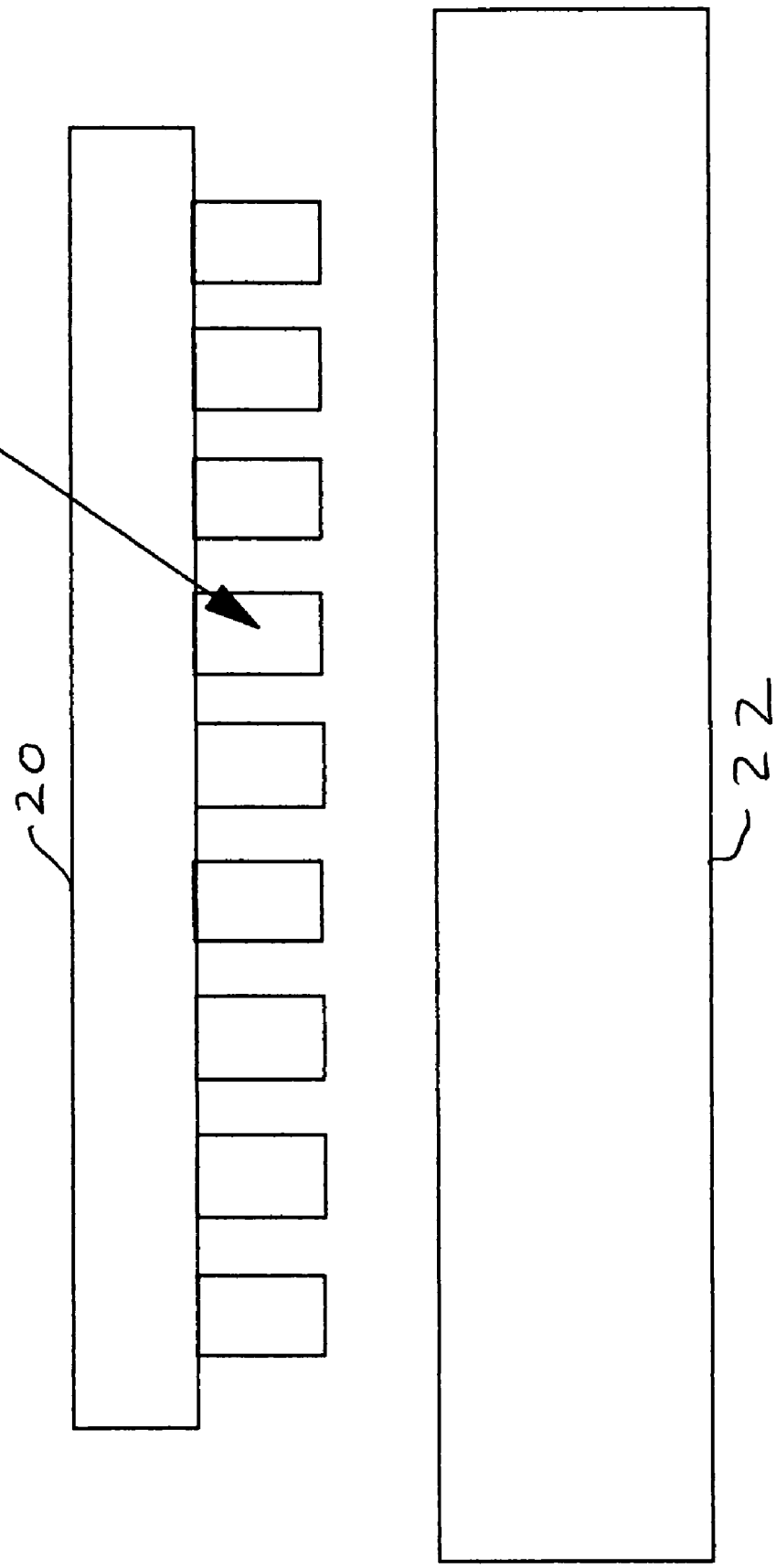
FIG. 3 shows an array of solder columns with an aspect ratio modestly greater than bumps, in accordance with the invention.

In FIG. 3, the solder has been molded into structures in the shape of columns 30, as a result of mold cavities that are preferably cylindrical in shape. The greater height to width aspect ratio of the columns, as compared to the prior art generally spherical shape, is able to accommodate the mechanical stresses since the columns 30 are able to bend slightly, which is especially desirable for the columns around the perimeter due to the greater DNP. In general, the height to width ratio, as noted above, will be referred to herein as aspect ratio, and in accordance with the invention, will have a value greater than one, as illustrated in FIG. 3, where the aspect ratio is modestly greater than one.

Advantageously, the material of the substrate 22, which has in the past been limited by differences in CTE from that of the chip 20, may be comprised of a broader range of materials. For example, the improved solder interconnects of the present invention can be used to make electrical connections to metallic electrical connection surfaces on substrates formed of organic materials, such as polymers having optimized electrical, mechanical and thermal properties. Current polymeric substrates are highly filled with inorganic particles to reduce CTE. The filler particles have negative effects on the electrical and mechanical properties of the polymeric materials.

The solder used to form the improved interconnects may be any one of those well known in the art. Standard eutectic PbSn solders having a melting temperature of 183° C. may be used. Tin-rich lead-free solders having a melting point of 217° C.-240° C. are also candidates. High lead solders with ninety five to ninety seven percent lead and the remainder substantially of tin, with a melting point of 320° C. may also be used.

The manner in which the electrical connections are made using, in general, more than one solder, is discussed below.

Figure 4:
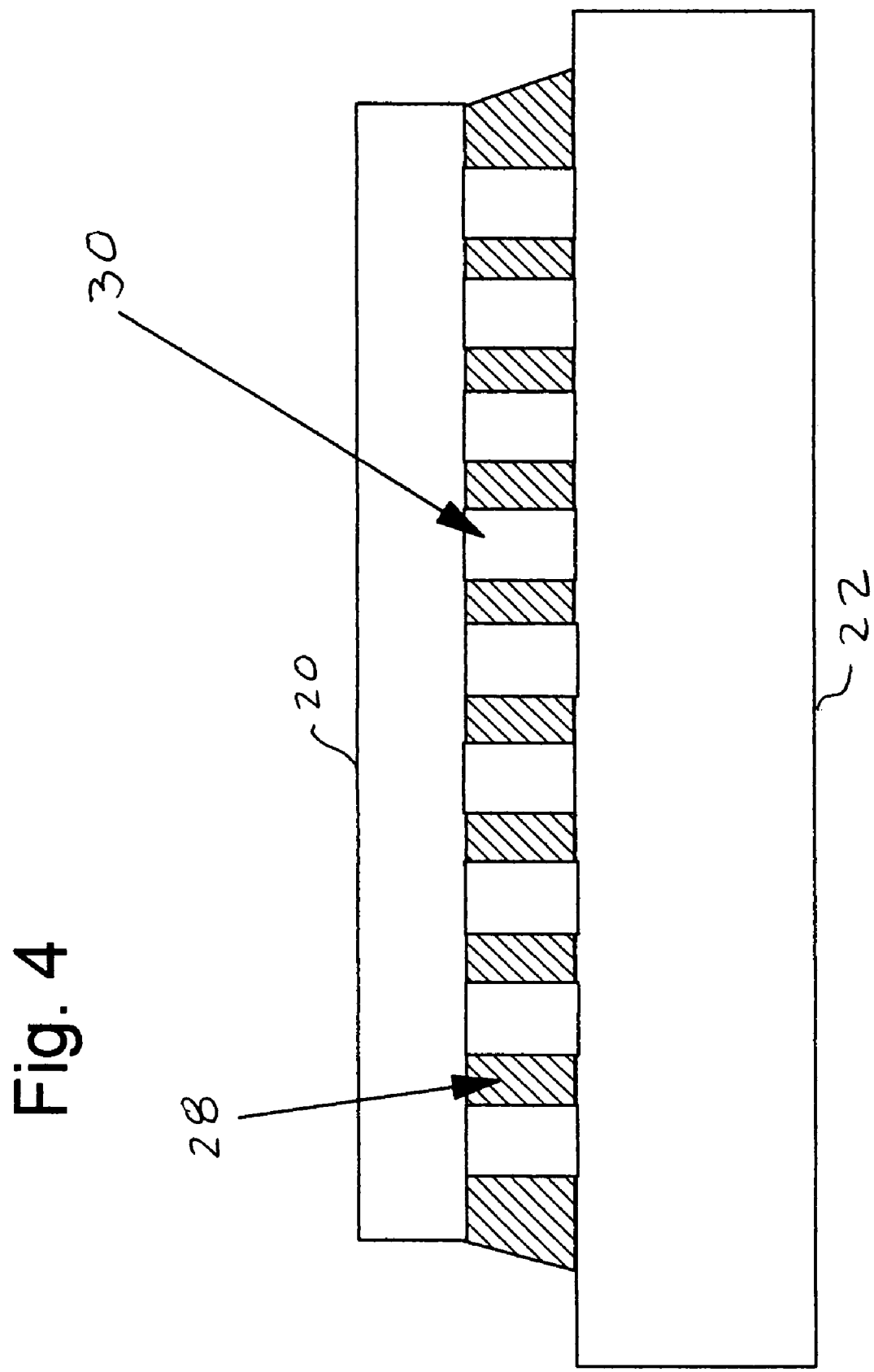
FIG. 4 shows the array of solder columns, in accordance with, FIG. 3, with an underfill layer.

FIG. 4 illustrates an embodiment of the invention similar to FIG. 3, except that the columns 30 are attached to the substrate 22 and an underfill layer is in place between the chip 20 and the substrate 22. Although the present invention can be used to eliminate the requirement for the underfill layer, in some applications, it may nevertheless be desirable to include an underfill layer 28, and the principles of the invention do not exclude the used of an underfill layer.

Figure 5:
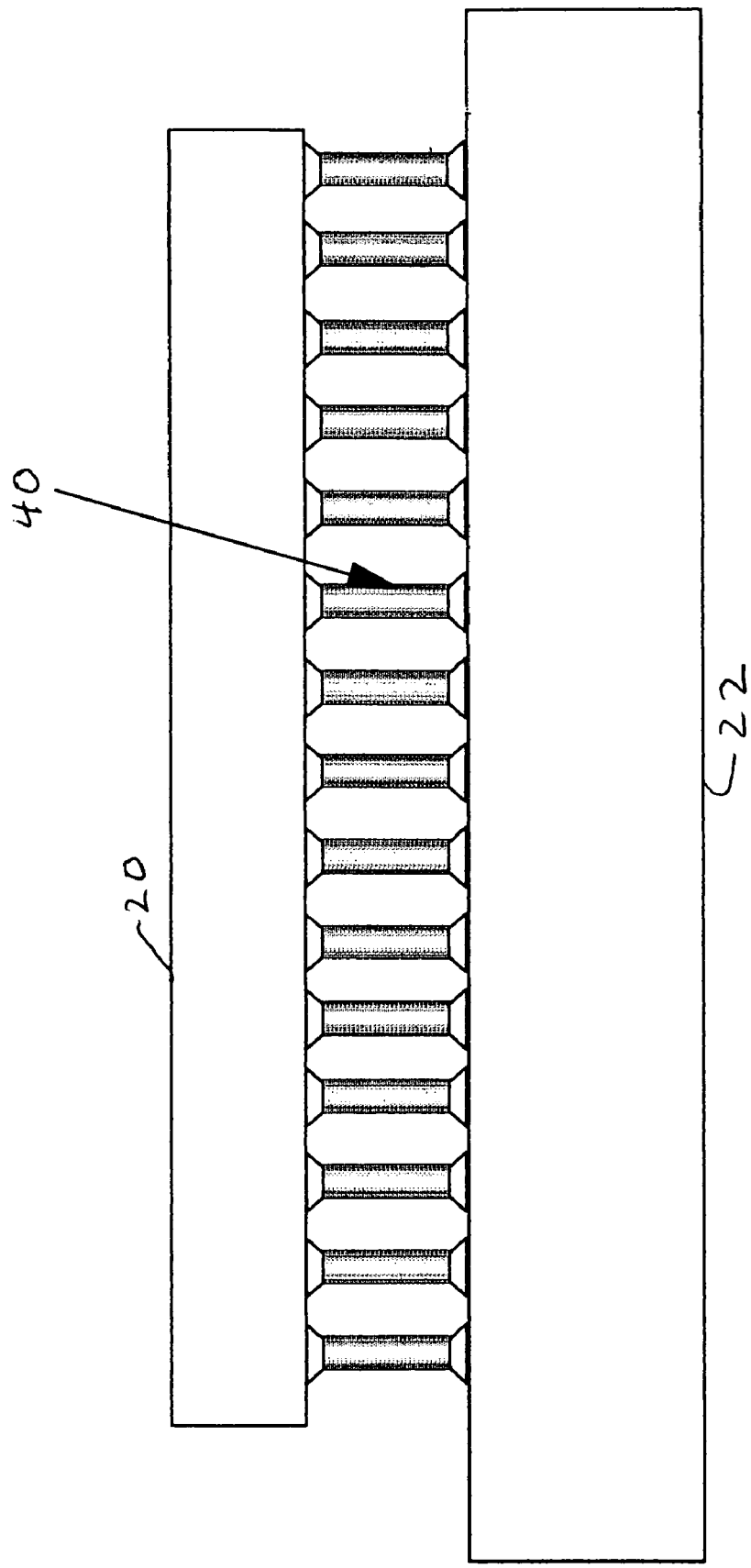
FIG. 5 illustrates the use of high aspect ratio solder columns, in accordance with the invention.

FIG. 5 illustrates an embodiment of the invention wherein columns 40 are formed of solder and have a high aspect ratio. The aspect ratio may also have a much greater value, such as 2:1 to 4:1, or even 10:1.

Figure 6:
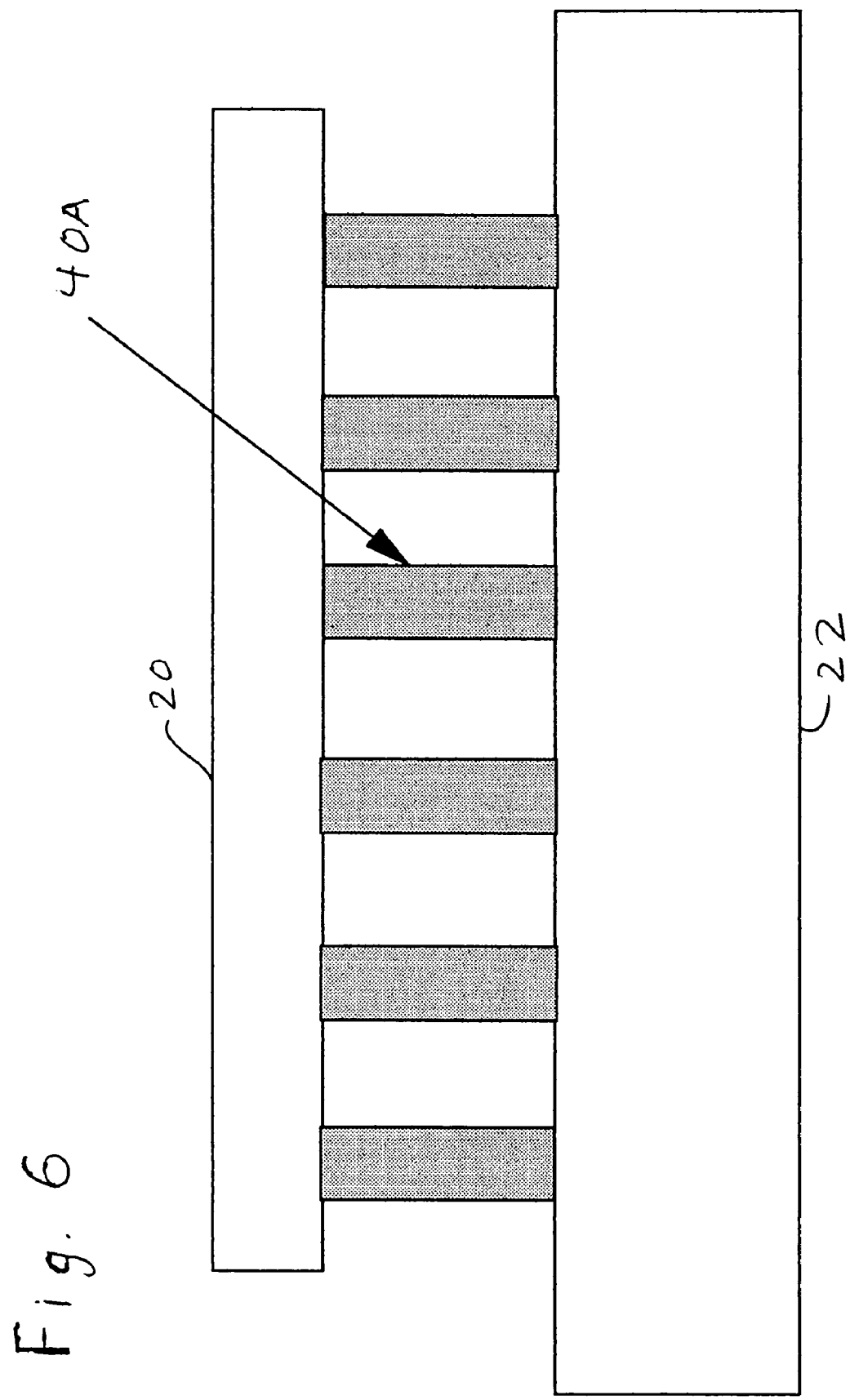
FIG. 6 illustrates the use of high aspect ratio solder columns with particulates mixed with the solder to produce more robust solder columns, in accordance with the invention.

Referring to FIG. 6, IMS provides the option of incorporating filler particles into the molten solder to give a composite material column 40A of increased mechanical strength. The composition of the filler particles may include metallic materials, graphitic carbon, ceramic powders and high temperature stable polymeric materials.

The ability to form solder columns and optionally add reinforcing particles to the solder is in sharp contrast to the conventional processes for fabricating solder bumps (solder paste screening, solder evaporation, and solder plating) that do not provide any flexibility in solder bump shape and composition. In all three of the prior art processes, the final shape of the solder bumps is nearly spherical, as the final step in each case is a solder reflow to eliminate the irregular shape resulting from screening, evaporation through a mask, or plating in openings in a photoresist. Forming a composite solder joint is also difficult with any of these prior art processes because they do not lend themselves to uniform mixing in of a non-solder material.

In accordance with the invention, by using IMS, the solder is handled in the molten state, and mixing in of a particulate material for reinforcement of the joints can be done in the molten state, to produce the composite columns 40A shown in FIG. 6.

Figure 7:
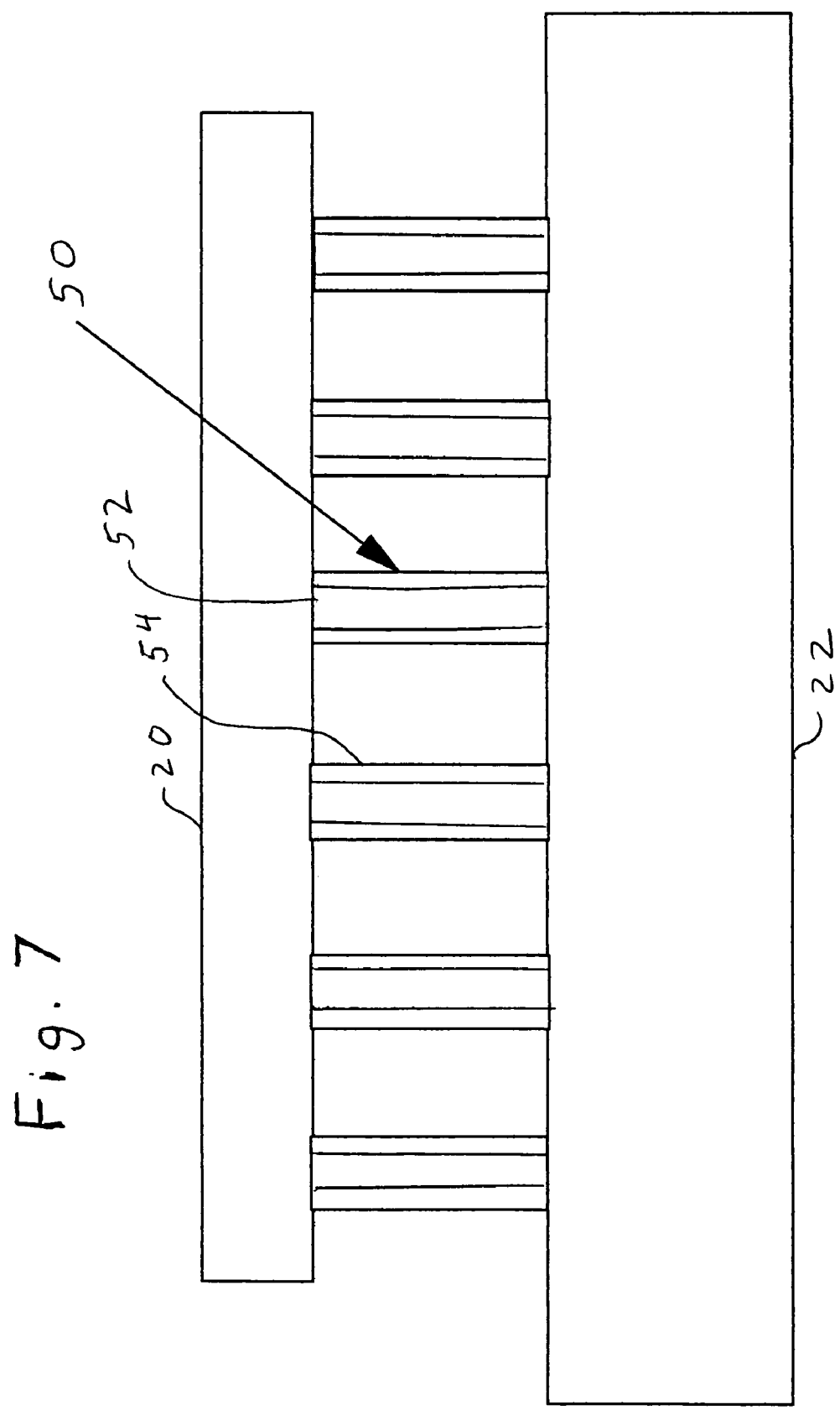
FIG. 7 illustrates the use of thin copper wire forming the core of more robust and more electrically conductive solder columns, in accordance with the invention.

In FIG. 7, in an alternative embodiment of the invention, columns 50, formed with a internal copper wire core 52, or another conductive metal wire such as nickel, tantalum, tungsten, or ruthenium, surrounded by solder 54, are utilized. Columns 50 are formed by placing the thin copper or other metal wire in the solder mold cavities before solder is injected. These copper cores 52 act as a "reinforcement member" for the solder that is then cast around the wire. The copper cores 52 also improve the electrical properties of the interconnect.

Figure 8:
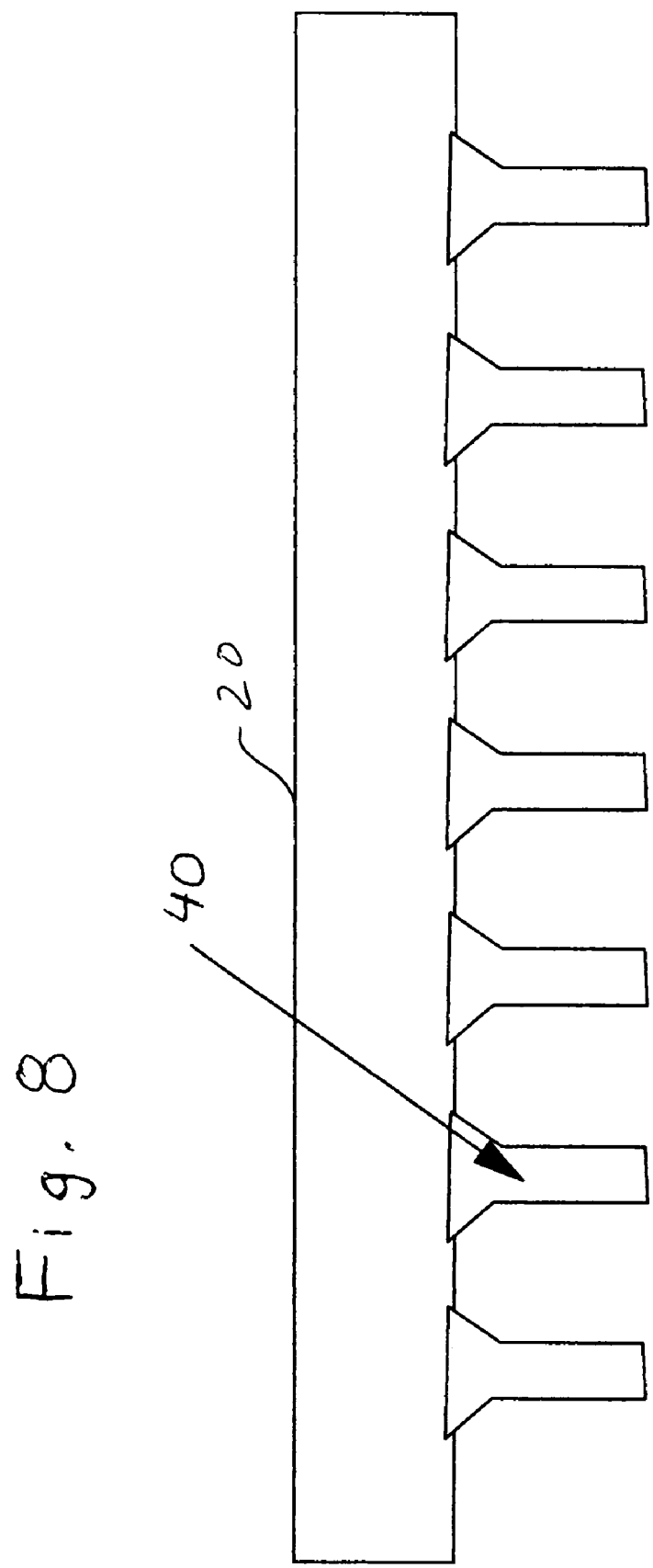
FIG. 8 shows higher temperature solder columns attached directly to a silicon die or wafer, in accordance with the invention.

As shown in FIG. 8, solder connections resulting in improved interconnects are usually produced with a solder hierarchy. Thus the molded solder columns, whether of the type 30 of FIG. 3 (or 40 of FIG. 5, 40A of FIG. 6 or 50 of FIG. 7 (with a conductive metal core)), are made of or with a higher temperature solder and are transferred at the elevated temperature to the entire wafer or individual silicon die to provide the greater standoff height.

Figure 9:
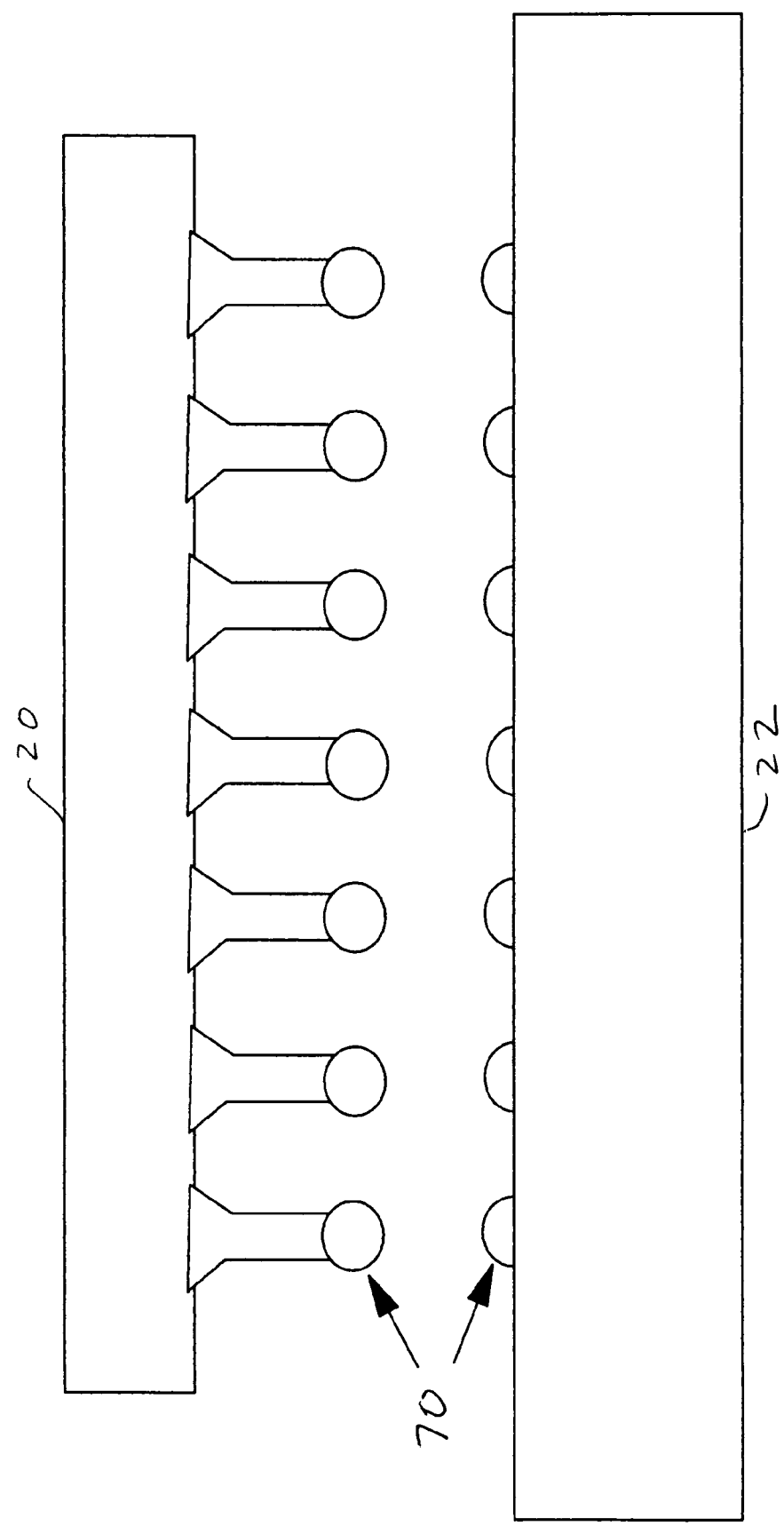
FIG. 9 shows lower temperature solder attached either to column tips or directly to the substrate, or both, in accordance with the invention.

FIG. 9 shows that a lower temperature solder 70 may be applied to either the substrate or the ends of the columns, and while generally not preferred, to both the substrate and the tips of the columns.

Figure 10:
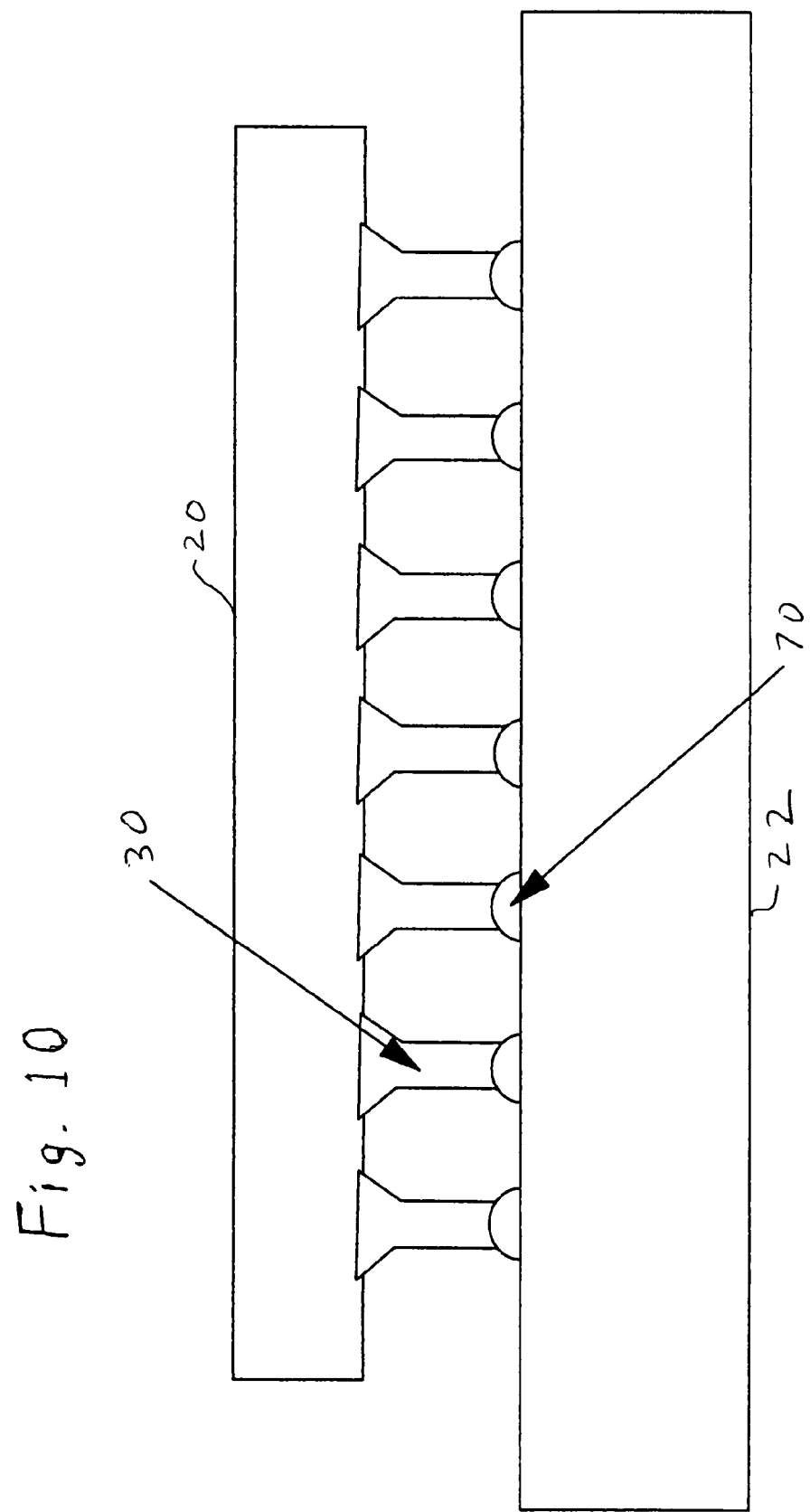
FIG. 10 shows the robust interconnect made between silicon chip and organic substrate with a lower temperature solder, in accordance with the invention.

As shown in FIG. 10, when the final solder joint to connect the die to the substrate is made by reflowing, this can be done by melting only the lower melting point solder 70, without remelting the solder of the columns 30.

Figure 11:
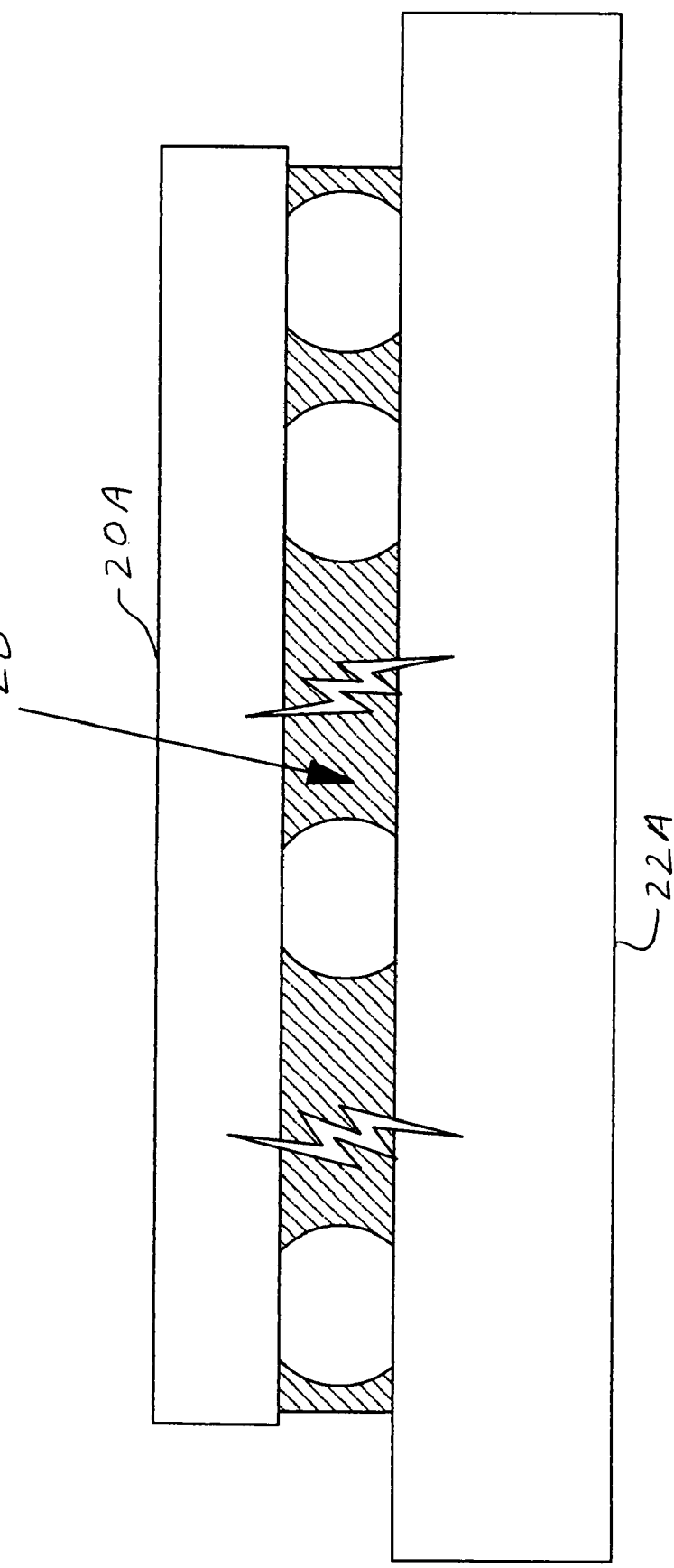
FIG. 11 shows how an opaque underfill prevents the formation of an optical pathway from the base of a chip to the substrate, as in the prior art.
Figure 12:
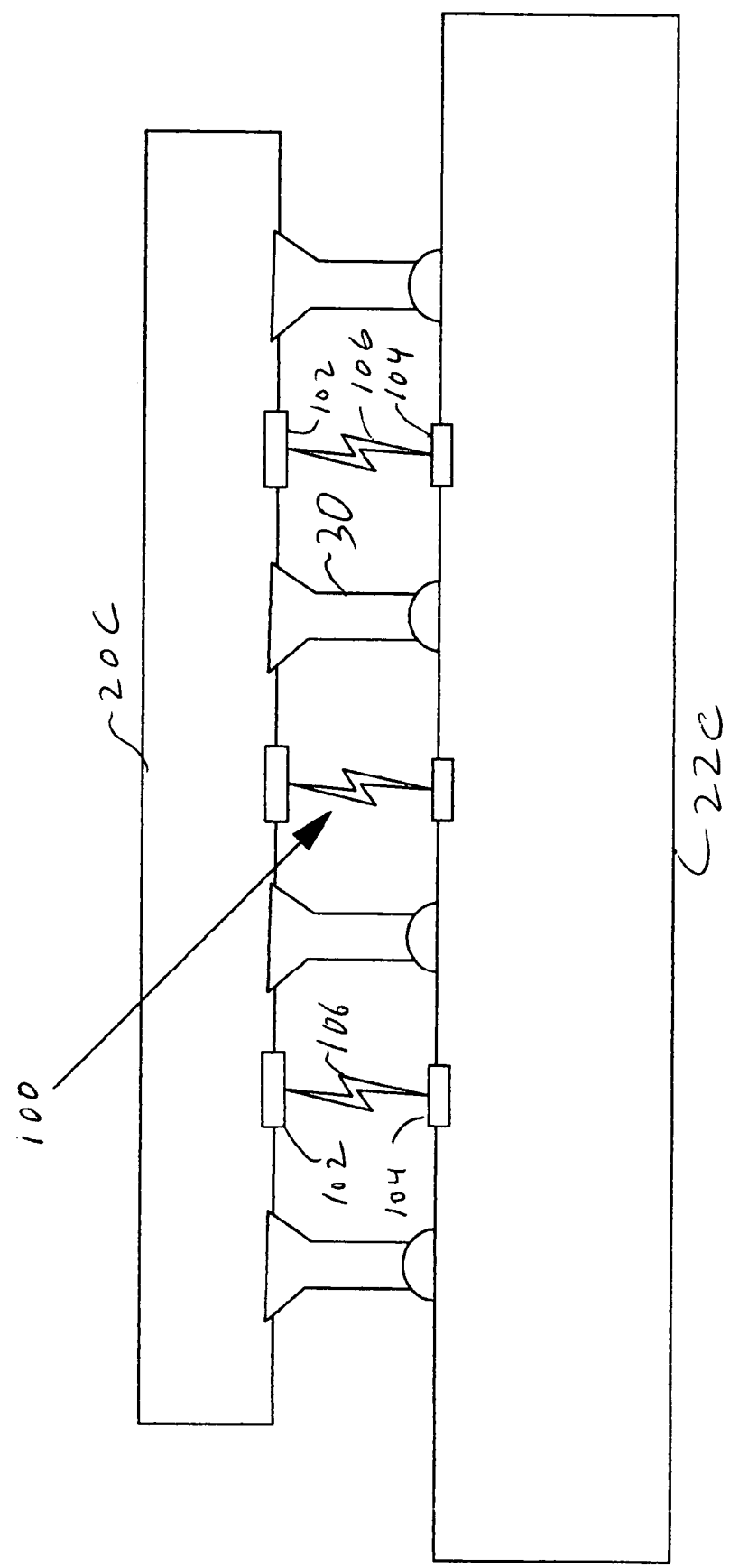
FIG. 12 shows how, in accordance with the invention, robust interconnects provide space for both optical and electrical communication.

FIG. 11 and FIG. 12 illustrate another key advantage of robust interconnects produced by the invention. As newer schemes involving optical and electrical interconnections in a hybrid package become more generally available, there will be a need to provide an optical pathway from the optical diodes, or other optical devices that are interspersed with electrically active pads at the base of the silicon die or chip 20A to the organic substrate 22A containing other optical components. In the prior art of FIG. 11, the opaque underfill layer 28 prohibits such an optical pathway.

In FIG. 12, the robust interconnects in accordance with the invention may eliminate the need for underfill. This allows such hybrid packages, by virtue of the fact that there is an unimpeded pathway, to have optical communication 100 between the base of the silicon chip 20C and the substrate 22C. This permits many additional advances in combining the attributes, for example, of electrical connections, provided by interconnect columns 30 for power, and optical connections between optical components 102 and 104, along pathways 106 for signal, in the same package.

Eliminating the need for underfill by fabricating robust solder interconnects, as disclosed herein, considerably simplifies the assembly process and increase the applicability of bumped chips, i.e. flip chips. In the prior art, the complicated assembly and difficulty in reworking flip chips with underfill has limited the use of flip chips to single chip packages or to multi-chip packages on ceramic substrates for which the CTE mismatch is tolerable without underfill. The improved solder interconnect technology of the present invention enables a much wider use of flip chips on plastic modules for the fastest growing markets for semiconductors. The improved solder interconnects can also be used with underfill, however. The increased standoff provided by cylindrical solder interconnects of aspect ratio of even as small as 1.5:1 will simplify the underfill process and increase the fatigue life of underfilled chips.

EXAMPLE 1

A preferred structure for improved flip chip interconnects may have cylindrical solder columns of diameter of 25-150 microns, preferably 50-100 microns. The interconnects may be 100-600 microns long, with an aspect ratio of length to diameter of 1.5:1-10:1, with a preferred range of 2:1 to 4:1. The method of fabrication of the interconnects can be described as follows.

A rectangular or square mold plate is patterned with an array of preferably cylindrical cavities. The mold plate can be of borosilicate glass, or be a composite of a laser machined polymer layer and glass, as disclosed in U.S. patent application Ser. No. 11/168,182, entitled Composite Solder Transfer Moldplate Structure and Method of Making Same, which is assigned to the same assigned as the present invention and is incorporated herein in its entirety. Further, the moldplate can be of a size to encompass a 200 mm or 300 mm wafer pattern such that the array of cavities exactly matches the array of electrical connection pads on the wafer to which the flip chip interconnects are to be joined. The cavities in the mold plate are fabricated by wet etching or laser etching by processes known in the art. The cavities have the dimensions of the flip chip interconnects, i.e. 50-150 microns diameter and 100-600 microns deep. The cavity diameter is preferably slightly wider at the top than at the bottom; for example, approximately five percent to twenty percent larger in diameter, to facilitate withdrawal of the interconnects from the mold.

The molten solder is transferred into the cavities containing the wires using the injection molded solder tool that has been described in previous U.S. Pat. No. 6,056,191. Following inspection of the filled mold plate to be certain that each cavity is filled with solder, the mold plate is aligned to the wafer, clamped and transferred into a solder reflow oven. As previously disclosed in U.S. Pat. No. 6,056,191, the solder preferentially wets the pads on the wafer, thereby transferring the solder column containing the copper wire to the wafer. After exiting the reflow oven, the solder cools and the mold plate is separated from the wafer, leaving the desired solder interconnects on the wafer, and providing the empty mold plate for reuse.

Following wafer test, inspection and dicing, the chips are ready for package bond and assembly. Because the improved solder interconnects of this example have a height to diameter aspect ratio greater than one, if desired, underfilling of following flip chip bonding is facilitated in comparison to packages using conventional spherical solder bumps.

EXAMPLE 2

Another preferred structure for improved flip chip interconnects is one in which a copper wire of diameter 25-100 microns is embedded in a solder column of diameter 50-150 microns. The interconnects may be 100-600 microns long, with an aspect ratio of length to diameter of 1.5:1-10:1, with a preferred range of 2:1 to 4:1. The method of fabrication of the interconnects can be described as follows.

A rectangular or square mold plate is patterned with an array of preferably cylindrical cavities. The mold plate can be of borosilicate glass or be a composite of polymer and glass, as disclosed in U.S. patent application Ser. No. 11/168,182, entitled Composite Solder Transfer Moldplate Structure and Method of Making Same, which is incorporated herein in its entirety. Further, the moldplate is of a size to encompass a 200 mm or 300 mm wafer pattern such that the array of cavities exactly matches the array of electrical connection pads on the wafer to which the flip chip interconnects are to be joined. The cavities in the mold plate are fabricated by wet etching or laser etching by processes known in the art. The cavities have the dimensions of the flip chip interconnects, i.e. 50-150 microns diameter and 100-600 microns deep. The cavity diameter is preferably slightly wider at the top than at the bottom; for example, approximately five percent to twenty percent larger in diameter, to facilitate withdrawal of the interconnects from the mold.

The copper wire is thinly coated by electroplating with solder-wettable metals such as nickel and gold. A single copper wire is placed in each cavity in the mold plate. Several methods can be used to facilitate transfer of the copper wire to the cavities in the mold plate. In the first method, a wire bonding tool is used to feed a controlled length of the wire into each cavity and each wire can be cut by flame-off, a process well known in the art wherein the wire is melted by a high temperature flame. The length of wire must be no longer than the depth of the cavities or preferably one percent to two percent shorter. Alternatively, in the second method, a thin glass plate or polymer film is fabricated with through-holes of diameter slightly larger than the copper wire in an array exactly matching the array of cavities in the mold plate. This plate is aligned with the mold plate and clamped together with it. The copper wire is then precut into lengths slightly less than the depth of the cavities and a collection of these wires is agitated over the openings until a single wire falls into each of the cavities below. In a third method, a programmable pick and place tool is used to insert a single length of precut and electroplated wire in each cavity in the mold plate.

Once the copper wires are in place, the molten solder is transferred into the cavities containing the wires using the injection molded solder tool that has been described in previous U.S. Pat. No. 6,056,191. Following inspection of the filled mold plate to be certain that each cavity is filled with solder and copper wire, the mold plate is aligned to the wafer, clamped and transferred into a solder reflow oven. As previously disclosed in U.S. Pat. No. 6,056,191, the solder preferentially wets the pads on the wafer, thereby transferring the solder column containing the copper wire to the wafer. After exiting the reflow oven, the solder cools and the mold plate is separated from the wafer, leaving the desired composite solder/copper interconnects on the wafer, and providing the empty mold plate for reuse.

Following wafer test, inspection and dicing, the individual chips are ready for package bond and assembly. The improved solder interconnects of this example provide superior mechanical and electrical properties to the resultant packages in comparison to those resulting from the use of conventional spherical solder bumps.

Variations described for the present invention can be realized in any combination desirable for each particular application. Thus particular limitations, and/or embodiment enhancements described herein, which may have particular advantages to the particular application need not be used for all applications. Also, it should be realized that not all limitations need be implemented in methods, systems and/or apparatus including one or more concepts of the present invention.

The table below indicates the characteristics and advantages of some of the various combinations of elements that may be assembled in accordance with the principles of the invention.

TABLE 1

Matrix of Improved Interconnect Combinations

| Column Type | Modest Aspect Ratio (1.5-2.0) Interconnects with Underfill | High Aspect Ratio (>2.0) Interconnects with Partial or |
| --- | --- | --- |

TABLE 1-continued

Matrix of Improved Interconnect Combinations

| | | |
|---|---|---|
| Plain solder | Enables underfill for dense I/O arrays | No Underfill Enables use of partial underfill; for electrical and optical I/O |
| Particle-filled solder | Improves interconnect robustness for mechanically stressed packages with large chips | Enables elimination of underfill; for electrical and optical I/O (input/output) |
| Copper Core + Solder | Interconnects for lowest electrical resistance and improved package robustness | Interconnects for optimal electrical and optical I/O |

It is noted that the foregoing has outlined some of the more pertinent objects and embodiments of the present invention. The concepts of this invention may be used for many applications. Thus, although the description is made for particular arrangements and methods, the intent and concept of the invention is suitable and applicable to other arrangements and applications. It will be clear to those skilled in the art that other modifications to the disclosed embodiments can be effected without departing from the spirit and scope of the invention. The described embodiments ought to be construed to be merely illustrative of some of the more prominent features and applications of the invention. Other beneficial results can be realized by applying the disclosed invention in a different manner or modifying the invention in ways known to those familiar with the art. Thus, it should be understood that the embodiments has been provided as an example and not as a limitation. The scope of the invention is defined by the appended claims.

Having thus described our invention, what we claim as new and desire to secure by Letters Patent is as follows:

1. A method for connecting an electrical device having first electrical connection surfaces to a substrate having corresponding second electrical connection surfaces, comprising:
    forming a plurality of columns at least partially of solder so as to be electrically connected to one of said first electrical connection surfaces and said second electrical connection surfaces; wherein electrical connections are made between first ends of said plurality of columns and said first electrical connection surfaces;
    forming electrical connections between said second electrical connection surfaces and second ends of respective ones of said plurality of columns;
    mixing particles with solder when the solder is in a molten state;
    forming said columns in cavities of a mold plate by injection molded soldering of said solder, said columns having an aspect ratio of between 1.5 and ten;
    coating, by electroplating, elongate metal conductors of a material other than solder with a solder-wettable metal;
    placing said metal conductors within respective columns in said mold plate prior to injecting solder into said cavities;
    aligning, with an array of cavities in the mold plate, an array of through-holes in a plate, the through-holes being slightly larger in diameter than the conductors;
    removably fastening the plate to the mold plate;
    placing conductors in the vicinity of the through-holes;
    agitating the conductors over the through-holes until a respective conductor moves into each of the cavities;
    providing first optical components on said electrical device and second optical components on said substrate, said first optical components and said second optical components being positioned with respect to one another so that there is a respective optical path between each one of said first optical components and a respective one of said second optical components, said optical paths having no underfill material; wherein:
    said columns are formed of a first solder with a first melting point temperature, further comprising soldering said columns to the other of said first surfaces and second surfaces with a second solder having a second melting point temperature lower than said first melting point temperature; and
    said second solder is applied to at least one of said first electrical connection surfaces and said second electrical connection surfaces prior to connecting second ends of said columns to said first surface and said second surfaces.

2. A method as recited in claim 1, wherein said elongate metal conductor is formed of a material selected from the group consisting of copper, nickel, tantalum, tungsten, and ruthenium.

3. A method as recited in claim 1, wherein said solder wettable metal is selected from the group consisting of nickel, gold and silver, or combinations thereof.

4. A method as recited in claim 1, wherein said particles have a composition of metal, graphite, ceramic or high temperature polymer.

5. A method as recited in claim 1, wherein said electrical device is a semiconductor chip.

6. A method as recited in claim 1, wherein said substrate is formed of an organic material.

7. A method as recited in claim 1, wherein said optical pathways are located among said plurality of columns.

8. A method for connecting an electrical device having first electrical connection surfaces to a substrate having corresponding second electrical connection surfaces, comprising:
    forming a plurality of columns at least partially of solder so as to be electrically connected to one of said first electrical connection surfaces and said second electrical connection surfaces; wherein electrical connections are made between first ends of said plurality of columns and said first electrical connection surfaces;
    forming electrical connections between said second electrical connection surfaces and second ends of respective ones of said plurality of columns;
    mixing particles with solder when the solder is in a molten state;
    forming said columns in cavities of a mold plate by injection molded soldering of said solder, said columns having an aspect ratio of between 1.5 and ten;
    coating, by electroplating, elongate metal conductors of a material other than solder with a solder-wettable metal;
    placing said metal conductors within respective columns in said mold plate prior to injecting solder into said cavities;
    providing first optical components on said electrical device and second optical components on said substrate, said first optical components and said second optical components being positioned with respect to one another so that there is a respective optical path between each one of said first optical components and a respective one of said second optical components, said optical pathways being located among said plurality of columns; and using a pick and place tool to place an elongate metal conductor of a material other than solder within said columns in said mold prior to injecting solder into said cavities; wherein:

said columns are formed of a first solder with a first melting point temperature, further comprising soldering said columns to the other of said first surfaces and second surfaces with a second solder having a second melting point temperature lower than said first melting point temperature; and said second solder is applied to at least one of said first electrical connection surfaces and said second electrical connection surfaces prior to connecting second ends of said columns to said first surface and said second surfaces.

9. A method as recited in claim 8, wherein said elongate metal conductor is formed of a material selected from the group consisting of copper, nickel, tantalum, tungsten, and ruthenium.

10. A method as recited in claim 8, wherein said solder wettable metal is selected from the group consisting of nickel, gold and silver, or combinations thereof.

11. A method as recited in claim 8, wherein said particles have a composition of metal, graphite, ceramic or high temperature polymer.

12. A method as recited in claim 8, wherein said electrical device is a semiconductor chip.

13. A method as recited in claim 8, wherein said substrate is formed of an organic material.

* * * * *